United States Patent
Wang et al.

(10) Patent No.: US 7,619,307 B1
(45) Date of Patent: Nov. 17, 2009

(54) LEADFRAME-BASED SEMICONDUCTOR PACKAGE HAVING ARCHED BEND IN A SUPPORTING BAR AND LEADFRAME FOR THE PACKAGE

(75) Inventors: Chin-Fa Wang, Hsinchu (TW); Wan-Jung Hsieh, Hsinchu (TW); Yu-Mei Hsu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/133,898

(22) Filed: Jun. 5, 2008

(51) Int. Cl.
*H01L 23/48* (2006.01)
*H01L 23/52* (2006.01)
*H01L 23/495* (2006.01)

(52) U.S. Cl. .............. 257/692; 257/666; 257/670; 257/676; 257/690; 257/696; 257/E23.031; 257/E23.032; 257/E23.043; 257/E23.045; 257/E23.046; 257/E23.047; 257/E23.048; 257/E23.05; 257/E23.17

(58) Field of Classification Search ............ 257/666, 257/670, 676, E23.031, E23.032, E23.043, 257/E23.045, E23.046, E23.047, E23.048, 257/E23.05, E23.17, 690, 692, 696
See application file for complete search history.

(56) References Cited

U.S. PATENT DOCUMENTS

| | | | | |
|---|---|---|---|---|
| 5,150,194 A | * | 9/1992 | Brooks et al. ............... | 257/670 |
| 5,197,183 A | * | 3/1993 | Chia et al. .................... | 29/827 |
| 5,389,739 A | * | 2/1995 | Mills .......................... | 174/540 |
| 5,420,459 A | * | 5/1995 | Kozono ....................... | 257/666 |
| 6,256,200 B1 | * | 7/2001 | Lam et al. .................... | 361/704 |
| 6,307,755 B1 | * | 10/2001 | Williams et al. ............. | 257/666 |
| 6,897,550 B1 | * | 5/2005 | Zwenger et al. ............. | 257/666 |
| 7,256,482 B2 | * | 8/2007 | Kummerl et al. ............ | 257/676 |
| 7,381,593 B2 | * | 6/2008 | Ararao et al. ................ | 438/123 |
| 2007/0215996 A1 | * | 9/2007 | Otremba ...................... | 257/678 |
| 2008/0061413 A1 | * | 3/2008 | Otremba et al. ............. | 257/676 |
| 2009/0166822 A1 | * | 7/2009 | Camacho et al. ............ | 257/670 |

* cited by examiner

*Primary Examiner*—Ida M Soward
(74) *Attorney, Agent, or Firm*—Muncy, Geissler, Olds & Lowe, PLLC

(57) ABSTRACT

A leadframe-based semiconductor package and a leadframe for the package are revealed. The semiconductor package primarily includes parts of the leadframe including one or more first leads, one or more second leads, and a supporting bar disposed between the first leads and the second leads and further includes a chip attached to the first leads, the second leads and the supporting bar, a plurality of bonding wires and an encapsulant. The supporting bar has an extended portion projecting from the first bonding finger and the second bonding finger and connected to a non-lead side of the encapsulant wherein the extended portion has an arched bend to absorb the pulling stresses and to block stress transmission. Cracks caused by delamination of the supporting bar will not be created during trimming the supporting bar along the non-lead side of the encapsulant. Moisture penetration along the cracks of the supporting bar to the die-bonding plane under the chip is desirably prevented.

14 Claims, 4 Drawing Sheets though printed circuit boards and other substrates have gradually replaced leadframes as chip carriers of semiconductor packages, however, leadframe-based semiconductor packages still have the advantages of lower cost and high reliability. One of the leadframe-based semiconductor packages is Chip-On-Lead (COL) semiconductor package. The

LEADFRAME-BASED SEMICONDUCTOR PACKAGE HAVING ARCHED BEND IN A SUPPORTING BAR AND LEADFRAME FOR THE PACKAGE

FIELD OF THE INVENTION

The present invention relates to semiconductor packages, especially to leadframe-based semiconductor packages and leadframes for semiconductor packages.

BACKGROUND OF THE INVENTION

Even though printed circuit boards and other substrates have gradually replaced leadframes as chip carriers of semiconductor packages, however, leadframe-based semiconductor packages still have the advantages of lower cost and high reliability. One of the leadframe-based semiconductor packages is Chip-On-Lead (COL) semiconductor package. The backside of semiconductor chip is disposed on a plurality of leads of a leadframe. Then the chip is electrically connected to the fingers of the leads by a plurality of bonding wires formed by wire bonding. Finally, an encapsulant is formed by molding to encapsulate the chip and the bonding wires where the external leads of the leads exposed and extended from the sides of the encapsulant are used as the external electrical connections. Even though COL semiconductor packages are very mature packages, however, there are still some molding defects.

As shown in FIG. 1 and FIG. 2, a COL semiconductor package 100 comprises a plurality of first leads 110, a plurality of second leads 120, a chip 140, a plurality of first bonding wires 151, a plurality of second bonding wires 152, and an encapsulant 160. Each first lead 110 has a first external lead 111 and each second lead 120 has a second external lead 121. The first external leads 111 and the second external leads 121 are exposed and extended from two opposing sides of the encapsulant 160 and are properly bent for external electrical connections. The first leads 110 and the second leads 120 are further inwardly extended from two opposing sides of the encapsulant 160 where the lengths of the first leads 110 inside the encapsulant 160 are longer than the ones of the second leads 120 inside the encapsulant 160 for carrying the chip 140. The back surface of the chip 140 is attached to the first leads 110. The first bonding wires 151 connect from a plurality of bonding pads 141 disposed on the active surface 142 of the chip 140 to the bonding fingers of the first leads 110 and the second bonding wires 152 are bonded to the bonding fingers of the second leads 120. The encapsulant 160 encapsulates the chip 140, the bonding wires 151 and 152, parts of the first leads 110, and parts of the second leads 120.

However, as shown in FIG. 1, the chip 140 is only attached to the first leads 110 where the lengths of the first leads 110 must be long, therefore, the first leads 110 can not provide a strong structural strength to carry the chip 140. Moreover, during the formation of the encapsulant 160 by molding, the chip 140 is easily tilted or shifted due to mold flow, moreover, the first leads 110, the chip 140, or the first bonding wires 151 will easily expose from the encapsulant 160 leading to failure of the semiconductor packages.

SUMMARY OF THE INVENTION

The main purpose of the present invention is to provide a leadframe-based semiconductor package and a leadframe for the semiconductor package. The leadframe has a supporting bar disposed between the two symmetric leads to increase the carrying strengths for a chip to avoid tilting or shifting of a chip during molding processes and to eliminate broken bonding wires and exposed internal leads from the encapsulant.

The second purpose of the present invention is to provide a leadframe-based semiconductor package and a leadframe for the semiconductor package. The leadframe has a supporting bar with an arched bend as a stress-stopping point to avoid pulling stresses directly deliver to the die-bonding plane under the chip during trimming the supporting bar along the sides of an encapsulant. Moisture will not penetrate along cracks of the supporting bar into the die-bonding plane under the chip leading to delamination issues.

The third purpose of the present invention is to provide a leadframe-based semiconductor package and a leadframe for the semiconductor package. The leadframe has symmetric leads to increase carrying strengths for a chip without affecting the layout of the leads.

The fourth purpose of the present invention is to provide a leadframe-based semiconductor package and a leadframe for the semiconductor package to enhance the locking functions of the supporting bar inside an encapsulant.

According to the present invention, a leadframe-based semiconductor package is revealed, primarily comprising one or more first leads, one or more second leads, a supporting bar, a chip, a plurality of bonding wires, and an encapsulant. Each first lead has a first bonding finger and each second lead has a second bonding finger. The supporting bar is disposed between the first leads and the second leads. The chip is attached to the first leads, the second leads and the supporting bar where the chip has a plurality of bonding pads. The bonding wires are electrically bonded the bonding pads to the first bonding fingers and to the second bonding fingers. The encapsulant encapsulates parts of the first leads including the first bonding fingers, parts of the second leads including the second bonding fingers, the supporting bar, the chip, and the bonding wires. Moreover, the supporting bar has an extended portion projecting from the first bonding fingers and the second bonding fingers and connecting to a non-lead side of the encapsulant. The extended portion has an arched bend.

DETAIL DESCRIPTION OF THE INVENTION

Please refer to the attached drawings, the present invention is described by means of embodiments below.

Figure 1:
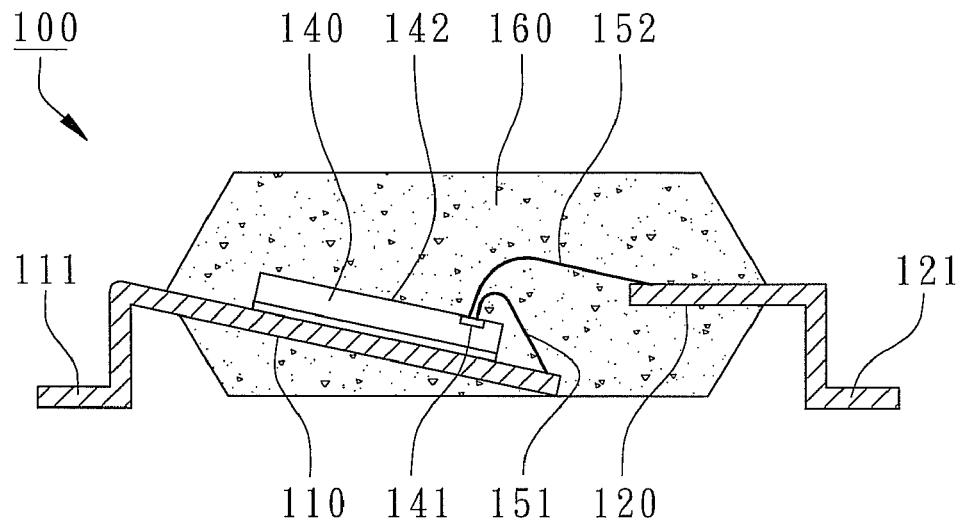
FIG. 1 is a cross-sectional view of a prior art leadframe-based semiconductor package.
Figure 2:
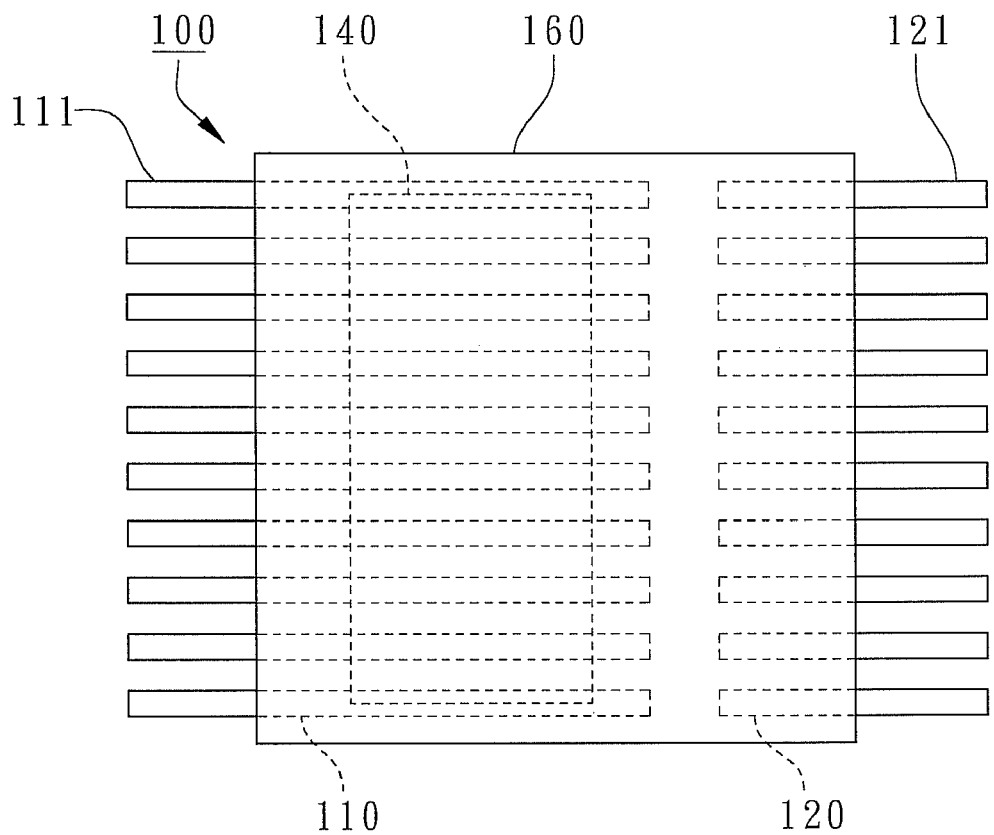
FIG. 2 is a top view of a prior art leadframe-based semiconductor package to show a chip disposed on the leads of a leadframe.
Figure 3:
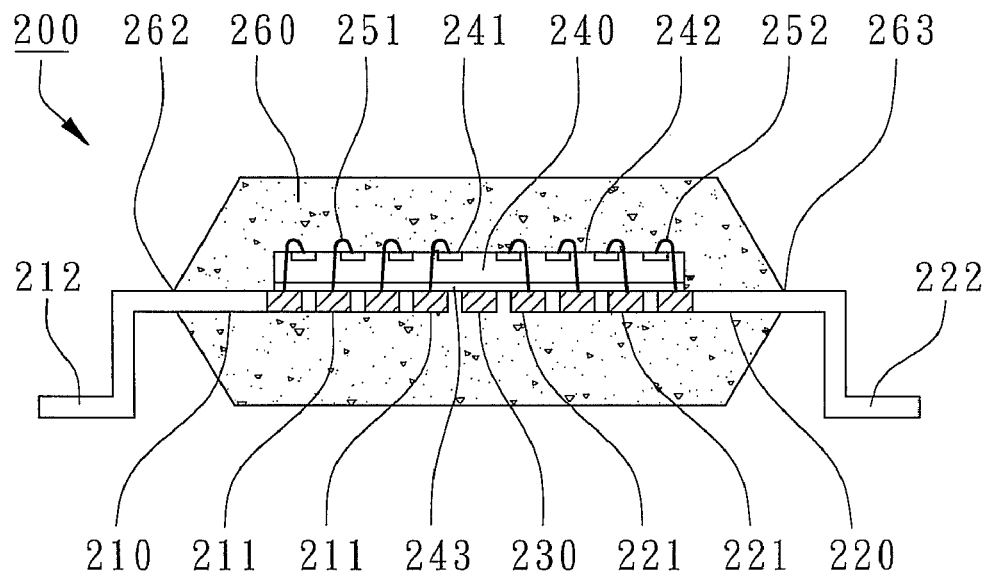
FIG. 3 is a cross-sectional view of a leadframe-based semiconductor package according to the preferred embodiment of the present invention.
Figure 4:
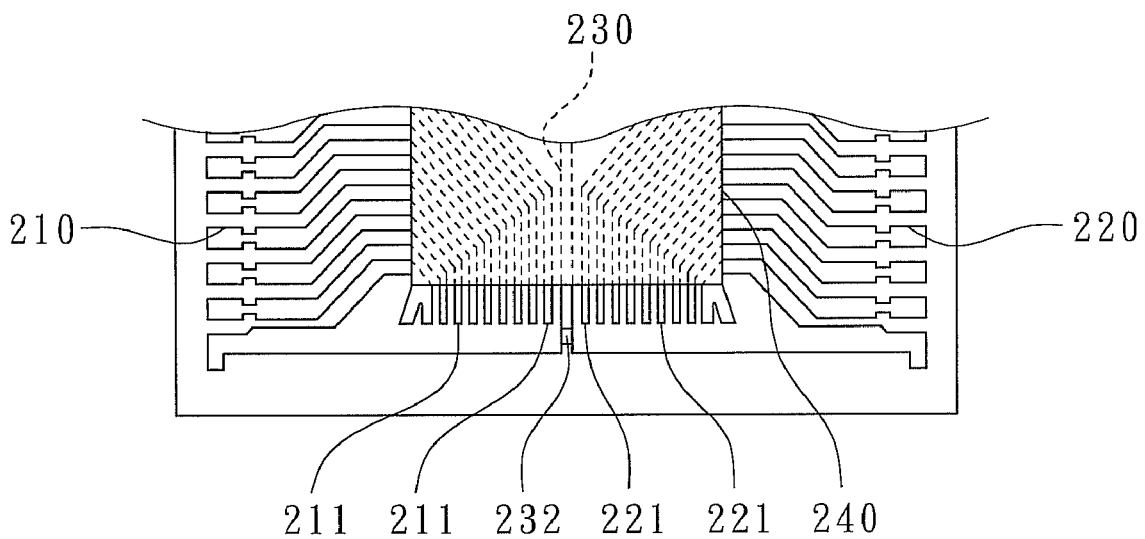
FIG. 4 is a partially top view of some components of a leadframe-based semiconductor package before encapsulation to show a chip disposed on the leads of a leadframe according to the preferred embodiment of the present invention.

According to the preferred embodiment of the present invention, a leadframe-based semiconductor package and a leadframe for the package are revealed. As shown in FIG. 3 and FIG. 4, the semiconductor package 200 primarily comprises one or more first leads 210, one or more second leads 220, a supporting bar 230, a chip 240, a plurality of first bonding wires 251, a plurality of second bonding wires 252, and an encapsulant 260. The semiconductor package 200 is a Chip-On-Lead (COL) package.

Figure 5:
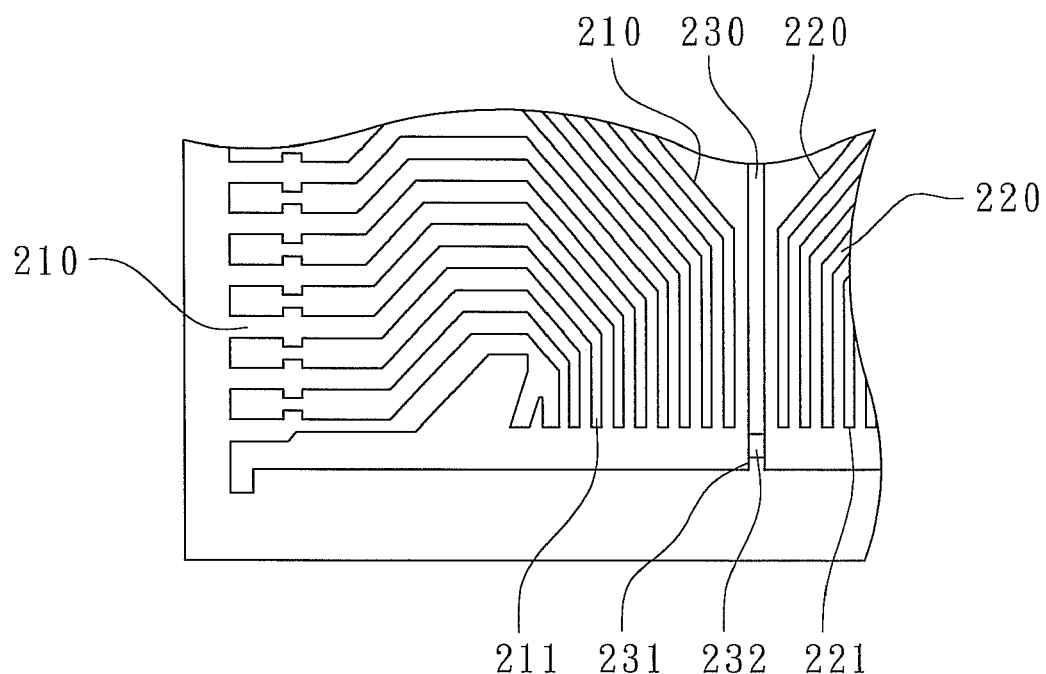
FIG. 5 is a partially top view of a leadframe for the leadframe-based semiconductor package according to the preferred embodiment of the present invention.
Figure 6:
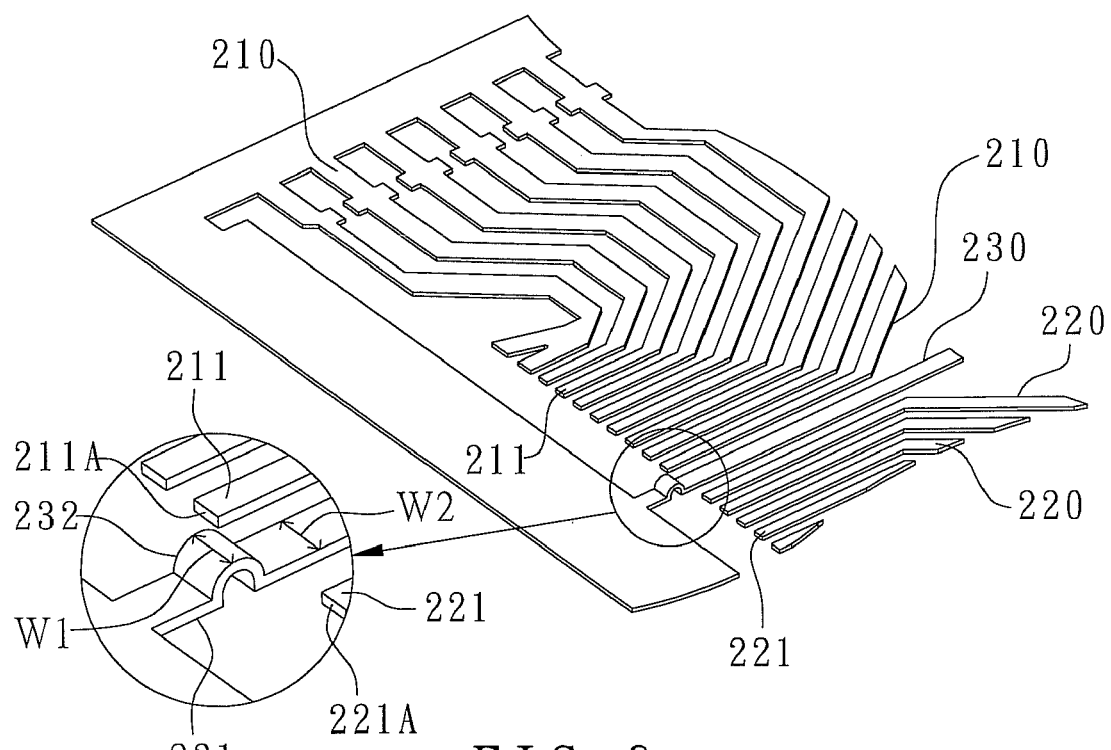
FIG. 6 is a partial three-dimensional view of the leadframe according to the preferred embodiment of the present invention.
Figure 7:
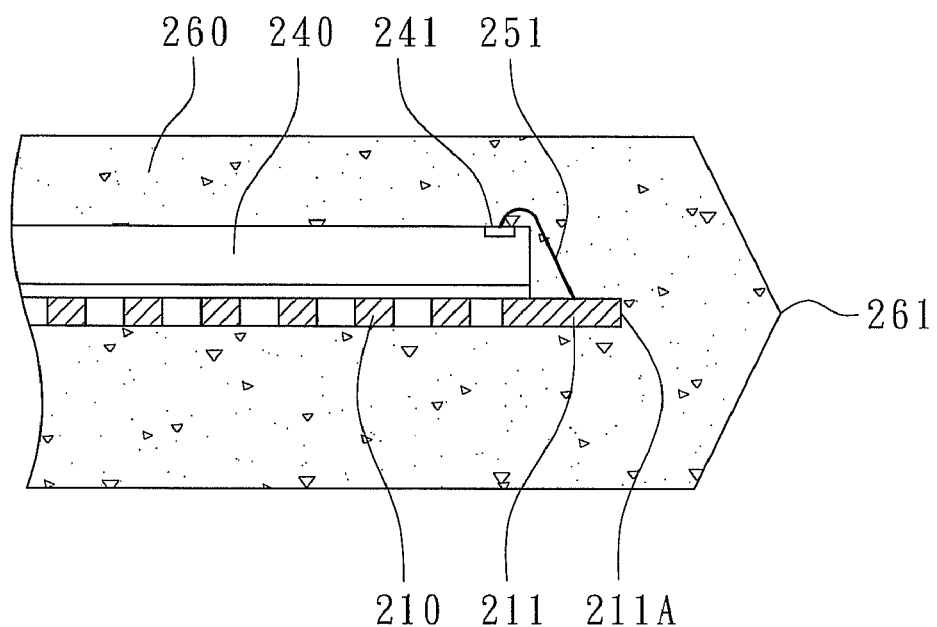
FIG. 7 is a partially cross-sectional view of the leadframe-based semiconductor package along one first bonding finger according to the preferred embodiment of the present invention.

As shown in FIG. 5 and FIG. 6, the first leads 210, the second leads 220, and the supporting bar 230 are parts of the same leadframe with proper thickness (about 0.2 mm thick) and made of the same metal material such as copper, iron or its alloy. Each first lead 210 has a first bonding finger 211 and each second lead 220 has a second bonding finger 221. The supporting bar 230 is disposed between the first leads 210 and the second leads 220 to increase the chip carrying strength of the leads. However, the supporting bar 230 has no external lead for external electrical connection and is only used to offer mechanical connection. As shown in FIG. 3, the external portion of the leads of a leadframe arranged on the same side of the encapsulant 260 is called "first leads" and the external portion of the leads of a leadframe arranged on the opposing side of the encapsulant 260 is called "second leads". In the present embodiment, there are a plurality of first leads 210 and a plurality of second leads 220 where the lead Counts of both the first leads 210 and the second leads 220 are about the same. However, the lengths of the adjacent first leads 210 or of the second leads 220 can be slightly different. The first bonding fingers 211 of the first leads 210 and the second bonding fingers 221 of the second leads 220 are linearly arranged. Therefore, the first leads 210 and the second leads 220 have free ends 211A and 221A respectively, i.e., the lead ends of the first 111 bonding fingers 211 and the second bonding fingers 221 are not connected to the first leads 210 nor the second leads 220. As shown in FIG. 6 and FIG. 7, the free ends 211A of the first bonding fingers 211 and the free ends 221A of the second bonding fingers 221 are arranged toward a non-lead side 261 of the encapsulant 260 without connecting to the non-lead side 261 to prevent bonding fingers exposed from the encapsulant 260 and from contaminations leading to electrical short in the environment. The non-lead side 261 is one of the sides of the encapsulant 260 from which no external lead extends. The leadframe includes an encapsulation area for forming the encapsulant 260 where the first leads 210 including the first bonding fingers 211, the second leads 220 including the second bonding fingers 221 and the supporting bar 230 are located within the encapsulation area except for the first external leads 212 of the first leads 210 and the second external leads 222 of the second leads 220.

Figure 8:
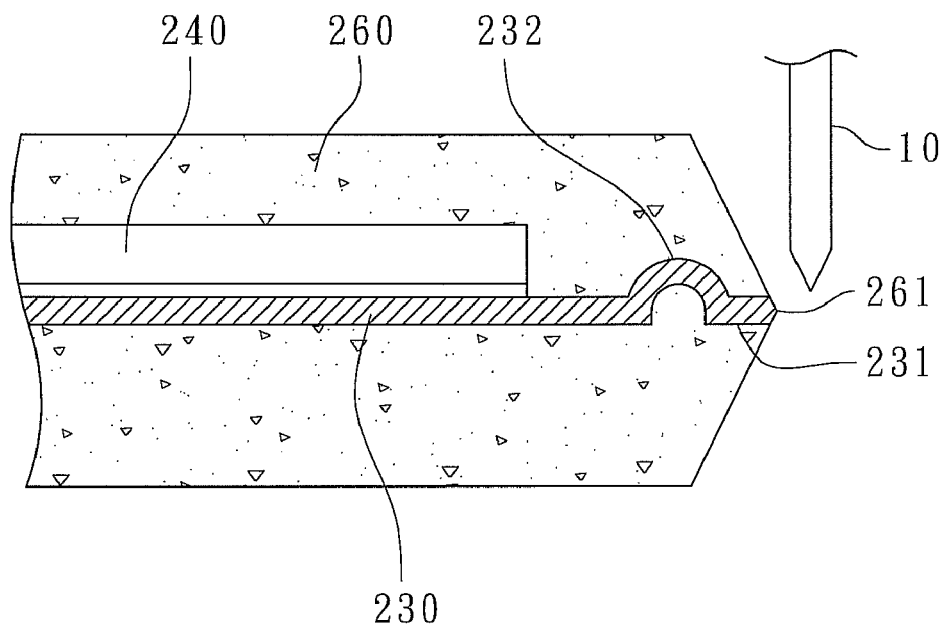
FIG. 8 is a partially cross-sectional view of the leadframe-based semiconductor package along the supporting bar according to the preferred embodiment of the present invention.

Furthermore, as shown in FIG. 5 and FIG. 6, the supporting bar 230 has an extending portion 231 projecting from the first bonding fingers 211 and the second bonding fingers 221 and connecting to the non-lead side 261 of the encapsulant 260, as shown in FIG. 8. Moreover, the extended portion 231 has an arched bend 232. Therefore, the supporting bar 230 can enhance the chip carrying strengths of the first leads 210 and the second leads 220 to the chip 240 to avoid shifting or tilting of the chip 240 attached on the first leads 210 and on the second leads 220 during packaging processes.

As shown in FIG. 3, the chip 240 is attached to the first leads 210, the second leads 220, and the supporting bar 230 where the chip 240 has a plurality of bonding pads 241. The chip 240 further has an active surface 242 and a back surface 243 where the bonding pads 241 and the IC components are disposed on the active surface 241. In the present embodiment, the back surface 243 is attached to the first leads 210, the second leads 220, and the supporting bar 230 such that the first bonding fingers 211, the second bonding fingers 221 and the arched bend 232 are located between the non-lead side 261 of the encapsulant 260 and the chip 240, as shown in FIG. 4, FIG. 7, and FIG. 8. Preferably, the portions of the first leads 210, the portions of the second leads 220, and the portion of the supporting bar 230 attached by the chip 240 are formed on a die-bonding plane. Normally, the die-bonding plane is the forming plane of the leadframe before semiconductor packaging processes. Moreover, the arched bend 232 is a half-circular arc extruded from the die-bonding plane, as shown in FIG. 6, without affecting the layout of the first bonding fingers 211 and the second bonding fingers 221.

As shown in FIG. 3, the first bonding wires 251 electrically connect some of the bonding pads 241 of the chip 240 to the first bonding fingers 211 and the second bonding wires 252 electrically connect the other bonding pads 241 of the chip 240 to the second bonding fingers 221, respectively, so that signals, power, and grounding of the chip 240 can be electrically connected to the first leads 210 and the second leads 220 and further be electrically connected to the first external leads 212 and the second external leads 222 at two opposing lead sides 262 and 263 of the encapsulant 260. As shown in FIG. 3, FIG. 7, and FIG. 8, the encapsulant 260 encapsulates parts of the first leads 210 including the first bonding fingers 211, parts of the second leads 220 including the second bonding fingers 221, the supporting bar 230, the chip 240, the first bonding wires 251, and the second bonding wires 252. In the present embodiment, the encapsulant 260 can be formed by transfer molding where the encapsulant 260 is a dielectric compound material including resin, silicon dioxide fillers, curing agents, dyes, etc.

As shown in FIG. 3 again, in the present embodiment, the semiconductor package 200 can be a TSOP (Thin Small Outline Package). The encapsulant 260 has a first lead side 262 and a second lead side 263 where the first lead side 262 and the second lead side 263 are parallel to and are connected to both ends of the non-lead side 261. The first external leads 212 of the first leads 210 are exposed and extended from the first lead side 262 and the second external leads 222 of the second leads 220 are exposed and extended from the second lead side 263 where the first external leads 212 and the second external leads 222 are formed into gull leads or other shapes such as I-shape or J-shape to SMT to an external printed circuit board, not shown in the figure. As shown in FIG. 4 again, in this embodiment, the first leads 210 and the second leads 220 are symmetric with respect to the supporting bar 230. Therefore, the external leads 212 and 222 disposed on different lead sides 262 and 263 of the encapsulant 260 can share the loading of the package 200 with the supporting bar 230 to get better chip carrying strengths. Furthermore, as shown in FIG. 5 and FIG. 6, the first leads 210 and the second leads 220 have planar bends for guiding the mold flow so that the molding gate for forming the encapsulant 260 can be disposed at the other non-lead side of the encapsulant 260 opposing to the non-lead side 261 to be away from the first bonding fingers 211, the second bonding fingers 221, and the sidewall of the arched bend 232 of the supporting bar 230 to avoid shifting or tilting of the chip 240 during molding.

As shown in FIG. 8, the encapsulant 260 further encapsulates the space enclosed by the arched bend 232 to form a pulling-stress stop point during trimming the supporting bar 230. In the present embodiment, the arched bend 232 and the free ends 211A, 221A of the fingers 211, 221 are completely encapsulated by the encapsulant 260. Therefore, the encapsulant 260 can firmly fix the supporting bar 230 without coming off nor loosening to further enhance the structural strengths and to further reinforce the locking functions of the supporting bar 230 inside the encapsulant 260 without changing the spacing between the first bonding fingers 211 or between the second bonding fingers 221. During singulation processes after molding, the dam bars horizontally connected between the adjacent first leads 210 and between the adjacent second leads 220 can be removed by the first dam-bar cutting processes, not shown in the figure. Then, the second dam-bar Cutting processes are performed so that the adjacent first leads 210 and the adjacent second leads 220 become independent leads. When the supporting bar 230 is cut along the non-lead side 261 of the encapsulant 260 by a punch tool 10 either during the first or the second dam-bar cutting processes, the arched bend 232 can absorb the pulling stresses and stop the stresses deliver through the supporting bar 230 to create cracks at the die-bonding plane under the chip 240 where the moisture will penetrate through the cracks leading to delamination of the supporting bar 230.

More specifically, as shown in FIG. 6, the width of the arched bend 232 is defined as the first width W1 and the width of a portion of the supporting bar 230 between the first bonding finger 211 and the second bonding finger 221 is defined as the second width W2 where the first width W1 is not be smaller than the second width W2 to provide a larger pulling flexibility so that the supporting bar 230 will not be shifted nor tilted when under stresses. Moreover, the arched bend 232 is a half-circular arc disposed and extruded from the die-bonding plane of the first leads 210 and the second leads 220 without affecting the layout of the first leads 210 and the second leads 220.

To be summarized, the arched bend 232 of the supporting bar 230 encapsulated by the encapsulant 260 and formed between the first leads 210 and the second leads 220 can avoid the shifting or tilting of the chip 240 during molding processes and can be used as a pulling-stress stop point for the supporting bar 230 to avoid moisture penetrating through the cracks along the supporting bar 230 leading to delamination. Moreover, the pull-stress stop point will not affect the layout of the leads nor the wire bonding processes.

The above description of embodiments of this invention is intended to be illustrative and not limiting. Other embodiments of this invention will be obvious to those skilled in the art in view of the above disclosure.

What is claimed is:

1. A leadframe-based semiconductor package primarily comprising:
one or more first leads having a first bonding finger;
one or more second leads having a second bonding finger;
a supporting bar disposed between the first leads and the second leads;
a chip disposed on the first leads, the second leads, and the supporting bar, the chip having a plurality of bonding pads;
a plurality of bonding wires electrically connecting the bonding pads to the first bonding finger and to the second bonding finger; and
an encapsulant encapsulating parts of the first leads including the first bonding finger, parts of the second leads including the second bonding finger, the supporting bar, the chip, and the bonding wires;
wherein the supporting bar has an extended portion projecting from the first bonding finger and the second bonding finger and connecting to a non-lead side of the encapsulant;
wherein the extended portion has an arched bend.

2. The leadframe-based semiconductor package of claim 1, wherein the encapsulant encapsulates the space enclosed by the arched bend.

3. The leadframe-based semiconductor package of claim 1, wherein the width of the arched bend is not smaller than the width of a portion of the supporting bar between the first bonding finger and the second bonding finger.

4. The leadframe-based semiconductor package of claim 1, wherein the encapsulant has a first lead side and the second lead side being parallel to each other and connected with both ends of the non-lead side; wherein the first leads further have a plurality of first external leads exposed and extended from the first lead side; wherein the second leads further have a plurality of second external leads exposed and extended from the second lead side; wherein the first bonding finger and the second bonding finger are adjacent to but not connecting to the non-lead side of the encapsulant.

5. The leadframe-based semiconductor package of claim 4, wherein the first leads and the second leads are symmetric with respect to the supporting bar.

6. The leadframe-based semiconductor package of claim 1, wherein the portions of the first leads, the portions of the second leads, and the portion of the supporting bar attached by the chip are formed on a die-bonding plane, wherein the arched bend has a half-circular profile extruded from the die-bonding plane.

7. The leadframe-based semiconductor package of claim 6, wherein the chip has an active surface and a back surface, and the bonding pads are disposed on the active surface; wherein the back surface is attached to the first leads, the second leads, and the supporting bar such that the first bonding finger, the second bonding finger and the arched bend are located between the chip and the non-lead side of the encapsulant.

8. The leadframe-based semiconductor package of claim 7, wherein each of the first and second bonding fingers has a free end toward the non-lead side; wherein the free ends are completely encapsulated by the encapsulant.

9. A leadframe for a leadframe-based semiconductor package, primarily comprising:
one or more first leads having a first bonding finger;
one or more second leads having a second bonding finger;
a supporting bar disposed between the first leads and the second leads;
wherein the supporting bar has an extended portion projecting from the first bonding finger and the second bonding finger and extending to a non-lead side of an encapsulation area;
wherein the extended portion has an arched bend.

10. The leadframe of claim 9, wherein the width of the arched bend is not smaller than the width of a portion of the supporting bar between the first bonding finger and the second bonding finger.

11. The leadframe of claim 9, wherein the encapsulation area has a first lead side and a second lead side being parallel to each other and connected with both ends of the non-lead side; wherein the first leads further have a plurality of first external leads extended from the first lead side; wherein the second leads further have a plurality of second external leads extended from the second lead side; wherein the first bonding finger and the second bonding finger are adjacent to but not extending to the non-lead side of the encapsulation area.

12. The leadframe of claim 11, wherein the first leads and the second leads are symmetric with respect to the supporting bar.

13. The leadframe of claim 9, wherein the portions of the first leads, the portions of the second leads, and the portion of the supporting bar are formed on a die-bonding plane; wherein the arched bend has a half-circular profile extruded from the plane.

14. The leadframe of claim 13, wherein each of the first and second bonding fingers has a free end toward the non-lead side; wherein the free ends are located within the encapsulation area.

* * * * *